(12) United States Patent
Hu et al.

(10) Patent No.: US 11,031,329 B2
(45) Date of Patent: *Jun. 8, 2021

(54) METHOD OF FABRICATING PACKAGING SUBSTRATE

(71) Applicant: PHOENIX & CORPORATION, Grand Cayman (KY)

(72) Inventors: Chu-Chin Hu, Hsinchu County (TW); Shih-Ping Hsu, Hsinchu County (TW); Che-Wei Hsu, Hsinchu County (TW); Chin-Ming Liu, Hsinchu County (TW); Chih-Kuai Yang, Hsinchu County (TW)

(73) Assignee: PHOENIX PIONEER TECHNOLOGY CO., LTD., Hsinchu County (TW)

( * ) Notice: Subject to any disclaimer, the term of this patent is extended or adjusted under 35 U.S.C. 154(b) by 189 days.

This patent is subject to a terminal disclaimer.

(21) Appl. No.: 15/961,973

(22) Filed: Apr. 25, 2018

(65) Prior Publication Data
US 2018/0240748 A1    Aug. 23, 2018

Related U.S. Application Data

(62) Division of application No. 15/402,362, filed on Jan. 10, 2017, now Pat. No. 10,002,823.

(30) Foreign Application Priority Data

May 23, 2016   (CN) .......................... 201610347780.6

(51) Int. Cl.
*H01L 23/498*   (2006.01)
*H01L 21/48*    (2006.01)
(Continued)

(52) U.S. Cl.
CPC ...... *H01L 23/49838* (2013.01); *H01L 21/486* (2013.01); *H01L 21/4853* (2013.01);
(Continued)

(58) Field of Classification Search
CPC ............... H05K 1/0284; H05K 1/0298; H05K 1/11105; H05K 1/181; H05K 2201/0367
See application file for complete search history.

(56) References Cited

U.S. PATENT DOCUMENTS 8,058,566 B2 * 11/2011 Hsu ........................ H05K 1/116
                                                                174/262
8,067,695 B2    11/2011 Kaneko
(Continued)

OTHER PUBLICATIONS

Non-Final Office Action for U.S. Appl. No. 15/402,362 dated Sep. 8, 2017, 31 pages.

*Primary Examiner* — Minh N Trinh
(74) *Attorney, Agent, or Firm* — Amin, Turocy & Watson LLP (57) ABSTRACT

A method of fabricating a packaging substrate is provided, which includes: forming on a carrier a conductor layer having a plurality of openings; forming a plurality of conductive bumps on the conductor layer, wherein each of the conductive bumps has a post body disposed in a corresponding one of the openings and a conductive pad disposed on the conductor layer, the post body being integrally formed with the conductive pad and less in width than the conductive pad; forming a plurality of conductive posts on the conductive pads; forming on the carrier a first insulating layer that encapsulates the conductive bumps and the conductive posts; removing the carrier; and removing the entire conductor layer to expose the post bodies from a first surface of the first insulating layer. As such, a semiconductor chip can be bonded to the packaging substrate through the conductive bumps.

13 Claims, 9 Drawing Sheets

(51) Int. Cl.
  *H05K 1/02* (2006.01)
  *H05K 1/11* (2006.01)
  *H05K 1/18* (2006.01)
  *H01L 23/00* (2006.01)
  *H01L 23/14* (2006.01)
  *H01L 23/31* (2006.01)
  *H01L 21/683* (2006.01)

(52) U.S. Cl.
  CPC ........ *H01L 21/6835* (2013.01); *H01L 23/145* (2013.01); *H01L 23/49816* (2013.01); *H01L 23/49822* (2013.01); *H01L 23/49827* (2013.01); *H01L 24/16* (2013.01); *H01L 24/32* (2013.01); *H05K 1/0298* (2013.01); *H05K 1/111* (2013.01); *H05K 1/181* (2013.01); *H01L 23/3128* (2013.01); *H01L 23/49811* (2013.01); *H01L 24/17* (2013.01); *H01L 24/73* (2013.01); *H01L 2221/68345* (2013.01); *H01L 2221/68359* (2013.01); *H01L 2224/13101* (2013.01); *H01L 2224/16238* (2013.01); *H01L 2224/32225* (2013.01); *H01L 2224/73204* (2013.01); *H01L 2224/83385* (2013.01); *H01L 2924/00014* (2013.01); *H01L 2924/01022* (2013.01); *H01L 2924/01028* (2013.01); *H01L 2924/01079* (2013.01); *H01L 2924/0665* (2013.01); *H01L 2924/07025* (2013.01); *H01L 2924/1579* (2013.01); *H01L 2924/15311* (2013.01); *H01L 2924/15738* (2013.01); *H01L 2924/15747* (2013.01); *H01L 2924/15763* (2013.01); *H01L 2924/181* (2013.01); *H01L 2924/19041* (2013.01); *H01L 2924/19042* (2013.01); *H01L 2924/19043* (2013.01); *H01L 2924/19105* (2013.01); *H05K 1/0284* (2013.01); *H05K 2201/0367* (2013.01)

(56) References Cited

U.S. PATENT DOCUMENTS

| | | | |
|---|---|---|---|
| 8,686,300 | B2 | 4/2014 | Kawai et al. |
| 9,497,864 | B2 | 11/2016 | Kung |
| 10,002,823 | B2* | 6/2018 | Hu .................... H01L 23/49822 |
| 2010/0147573 | A1 | 6/2010 | Fukuda |
| 2013/0250533 | A1 | 9/2013 | Kodani et al. |
| 2014/0239475 | A1* | 8/2014 | Lin .................... H01L 23/49816 |
| | | | 257/690 |
| 2015/0068033 | A1* | 3/2015 | Tseng ................ H01L 23/49822 |
| | | | 29/846 |

* cited by examiner

METHOD OF FABRICATING PACKAGING SUBSTRATE

CROSS-REFERENCE TO RELATED APPLICATIONS

This application is a Divisional of application Ser. No. 15/402,362 now U.S. Pat. No. 10,002,823, filed on Jan. 10, 2017, the entire contents of which are incorporated herein by reference.

This application is based upon and claims the benefit of priority from Chinese Patent Application No. 201610347780.6, now CN107424973B, filed May 23, 2016, the entire contents of which are incorporated herein by reference.

BACKGROUND

1. Technical Field

The present disclosure relates to packaging substrates, and, more particularly, to a packaging substrate having conductive bumps and a method of fabricating the same.

2. Description of Related Art

Along with the rapid development of electronic industries, electronic products are developed toward the trend of miniaturization and multi-function. Accordingly, various types of packages have been developed. Ball grid array (BGA) packaging technology is an advanced semiconductor packaging technology, which involves attaching a semiconductor chip to a surface of a packaging substrate and mounting a plurality of solder balls arranged in a grid array to an opposite surface of the packaging substrate. As such, more I/O connections are provided on a unit area of the packaging substrate so as to meet the high integration requirement. Further, the overall package structure can be bonded and electrically connected to an external device through the solder balls.

As semiconductor packages are developed toward the trend of miniaturization, multi-function, high-speed and high-frequency, semiconductor chips are required to have finer traces and smaller via holes.

Figure 1:
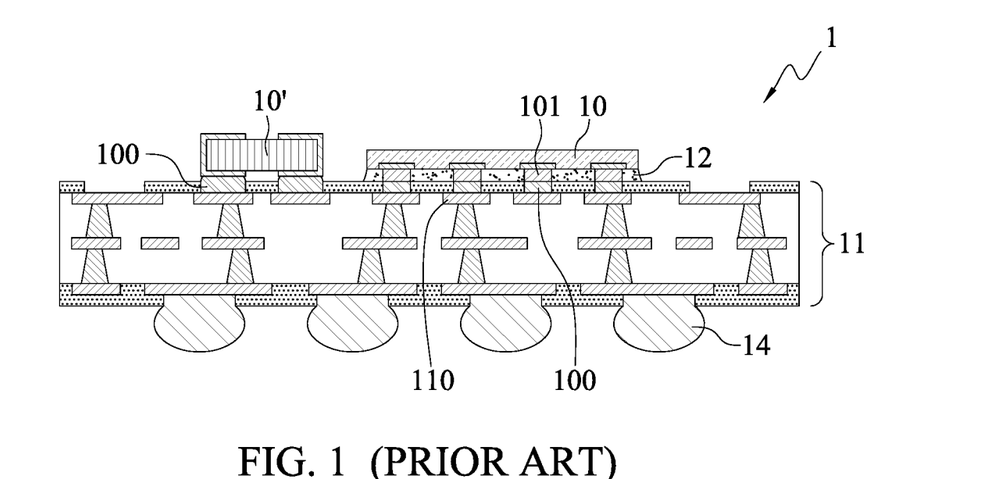
FIG. 1 is a schematic cross-sectional view of a conventional semiconductor package.

FIG. 1 is a schematic cross-sectional view of a conventional semiconductor package 1. A semiconductor chip 10 and a passive element 10' are disposed on an upper side of a packaging substrate 11 in a flip-chip manner, and a plurality of solder balls 14 are mounted on a lower side of the packaging substrate 11. In particular, a plurality of copper pillars 101 and solder bumps 100 of the semiconductor chip 10 are electrically connected to a plurality of conductive pads 110 of the packaging substrate 11, and an underfill 12 is formed and encapsulates the copper pillars 101. A plurality of solder bumps 100 of the passive element 10' are electrically connected to a plurality of conductive pads 110 of the packaging substrate 11. Therefore, an electroplating process is required to form the copper pillars 101 on the semiconductor chip 10 so as to facilitate fine-pitch connection between the semiconductor chip 10 and the packaging substrate 11.

The electroplating process for forming the copper pillars 101 on the semiconductor chip 10 incurs high costs and adversely affects production.

Further, during the electroplating process, the height of the copper pillars 101 is difficult to be controlled. If the copper pillars 101 have different heights, a grid array of the copper pillars 101 will have a poor coplanarity, thus causing uneven joint stresses and hence damage of the semiconductor chip 10.

Therefore, how to overcome the above-described drawbacks has become critical.

SUMMARY

In view of the above-described drawbacks, the present disclosure provides a packaging substrate, which comprises: a first insulating layer having a first surface and a second surface opposite to the first surface; a plurality of conductive bumps disposed on the first surface of the first insulating layer, wherein each of the conductive bumps has a post body exposed from the first surface of the first insulating layer and a conductive pad embedded in the first insulating layer, the post body being integrally formed with the conductive pad and less in width than the conductive pad; and a plurality of conductive posts disposed on the conductive pads and embedded in the first insulating layer.

In an embodiment, the post body protrudes from the first surface of the first insulating layer.

In an embodiment, at least a recessed portion is formed on the first surface of the first insulating layer in a manner that the conductive bumps are located in the recessed portion and the post bodies of the conductive bumps protrude from a bottom surface of the recessed portion.

In an embodiment, the packaging substrate further comprises a first circuit structure disposed in the first insulating layer and exposed from the first surface and the second surface of the first insulating layer.

In an embodiment, the packaging substrate further comprises a second circuit structure disposed on the second surface of the first insulating layer.

In an embodiment, the packaging substrate further comprises a second insulating layer formed on the second surface of the first insulating layer and encapsulating the second circuit structure, wherein a portion of the second circuit structure is exposed from the second insulating layer.

In an embodiment, the packaging substrate further comprises a barrier layer formed on the post bodies and exposed from the first surface of the first insulating layer.

The present disclosure further provides a method for fabricating a packaging substrate, which comprises: forming on a carrier a conductor layer having a plurality of openings; forming a plurality of conductive bumps on the conductor layer, wherein each of the conductive bumps has a post body disposed in a corresponding one of the openings and a conductive pad disposed on the conductor layer, the post body being integrally formed with the conductive pad and less in width than the conductive pad; forming a plurality of conductive posts on the conductive pads; forming on the carrier a first insulating layer that encapsulates the conductive bumps and the conductive posts; removing the carrier; and removing the entire conductor layer to expose the post bodies from a first surface of the first insulating layer.

In an embodiment, the post bodies protrude from the first surface of the first insulating layer.

In an embodiment, after the entire conductor layer is removed, a recessed portion is formed at a position corresponding to the conductor layer, and the post bodies of the conductive bumps protrude from a bottom surface of the recessed portion.

In an embodiment, the method further comprises, prior to forming a plurality of conductive bumps on the conductor layer, forming a first barrier layer on the conductor layer and in the openings.

In an embodiment, the first barrier layer is further formed on the carrier, and the method further comprises, after removing the entire conductor layer, removing the entire first barrier layer.

In an embodiment, the method further comprises forming a second barrier layer on the first barrier layer, and the method further comprises, after removing the entire conductor layer, removing the entire first barrier layer and the entire second barrier layer.

In an embodiment, the first barrier layer is formed only between the conductive bumps and the conductor layer. After the entire conductor layer is removed, the first barrier layer is exposed from the first surface of the first insulating layer.

In an embodiment, the method further comprises forming on the carrier a first circuit structure that is encapsulated by the first insulating layer.

In an embodiment, the method further comprises forming a second circuit structure on the first insulating layer and forming on the first insulating layer a second insulating layer that encapsulates the second circuit structure, wherein a portion of the second circuit structure is exposed from the second insulating layer.

Compared with the conventional process for fabricating copper pillars on a semiconductor chip, the present disclosure disposes conductive bumps on a packaging substrate so as to reduce costs and facilitate production.

Further, limited by the conductor layer on the carrier, an electroplating process for forming the conductive bumps is performed inward. As such, end surfaces of the post bodies of the conductive bumps have a uniform height, thereby meeting the fine-pitch requirement. For example, the post bodies of uniform height can be arranged in a grid array having a good coplanarity so as to ensure uniform joint stresses and avoid damage of the packaging substrate or electronic elements thereon.

DETAILED DESCRIPTION

The following illustrative embodiments are provided to illustrate the disclosure of the present disclosure, these and other advantages and effects can be apparent to those in the art after reading this specification.

It should be noted that all the drawings are not intended to limit the present disclosure. Various modifications and variations can be made without departing from the spirit of the present disclosure. Further, terms such as "first", "second", "on", "a" etc. are merely for illustrative purposes and should not be construed to limit the scope of the present disclosure.

FIGS. 2A to 2G are schematic cross-sectional views showing a method for fabricating a packaging substrate 2 according to a first embodiment of the present disclosure.

Figure 2A:
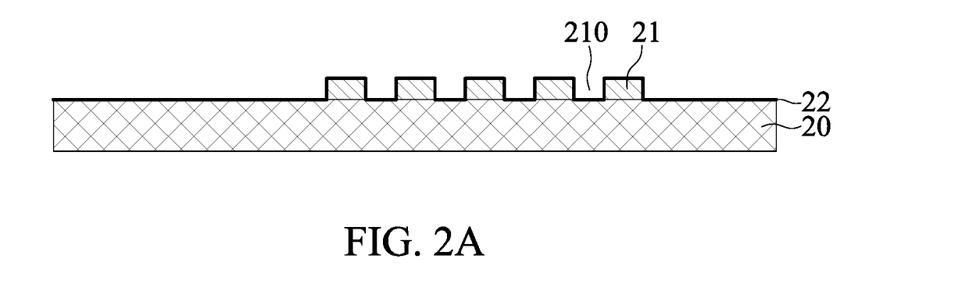
FIGS. 2A to 2G are schematic cross-sectional views showing a method for fabricating a packaging substrate according to a first embodiment of the present disclosure, wherein FIG. 2A' shows another embodiment of FIG. 2A, and FIGS. 2F' and 2F" show other embodiments of FIG. 2F.

Referring to FIG. 2A, a conductor layer 21 having a plurality of openings 210 is formed on a carrier 20 by a patterning process. Then, a first barrier layer 22 is formed on the carrier 20 and the conductor layer 21 and in the openings 210 of the conductor layer 21.

In an embodiment, the carrier 20 is a substrate such as a copper foil substrate, and the conductor layer 21 is formed on the carrier 20 by electroplating.

The conductor layer 21 and the first barrier layer 22 are made of different materials. In an embodiment, the conductor layer 21 is a metal layer such as a copper layer, and the first barrier layer 22 is a metal layer, such as a nickel layer, a gold layer or a titanium layer.

In another embodiment, referring to FIG. 2A', a second barrier layer 23 is further formed on the first barrier layer 22. The first barrier layer 22 and the second barrier layer 23 are made of different materials. In an embodiment, the second barrier layer 23 is a copper layer.

Figure 2B:
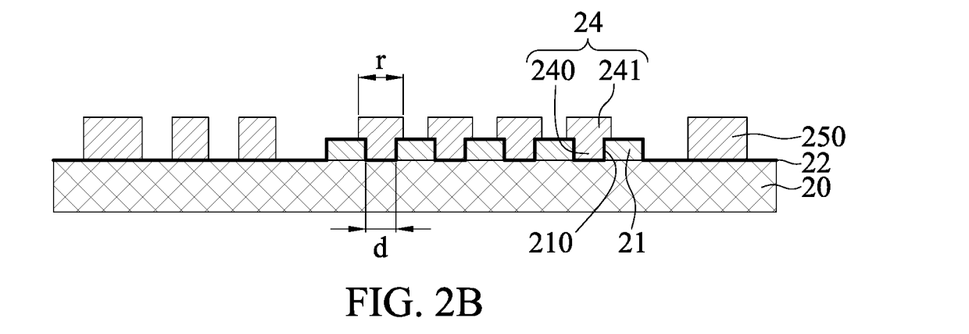

Referring to FIG. 2B, following the process of FIG. 2A, a plurality of conductive bumps 24 are disposed on the first barrier layer 22 on the conductor layer 21, and each of the conductive bumps 24 has a post body 240 disposed in a corresponding one of the openings 210 and a conductive pad 241 extending from and integrally formed with the post body 240. The width d of the post body 240 is less than the width r of the conductive pad 241.

In an embodiment, the conductive bumps 24 are formed by copper electroplating. Through the copper electroplating process, a first circuit layer 250 is further formed on the first barrier layer 22 on the carrier 20.

Figure 2C:
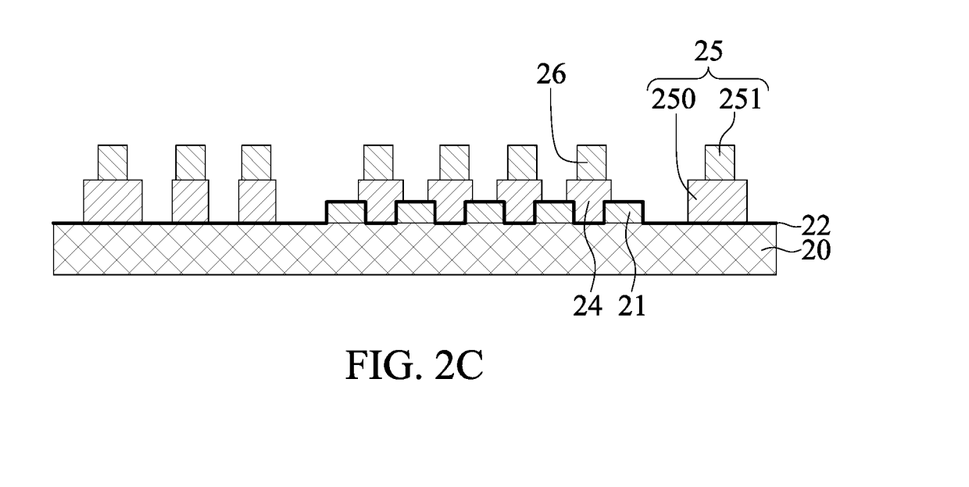

Referring to FIG. 2C, a plurality of conductive posts 26 are disposed on the conductive pads 241, and a plurality of first conductive posts 251 are disposed on the first circuit layer 250. The first conductive posts 251 and the first circuit layer 250 constitute a first circuit structure 25 on the carrier 20.

In an embodiment, the conductive posts 26 and the first conductive posts 251 are formed by copper electroplating.

Figure 2D:
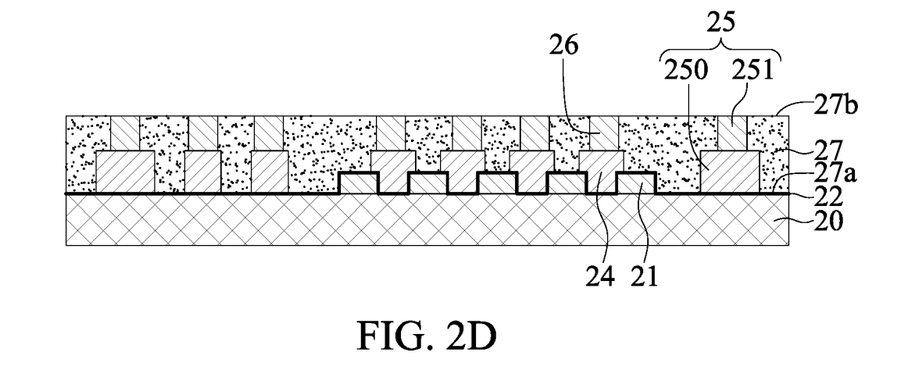

Referring to FIG. 2D, a first insulating layer 27 is formed on the first barrier layer 22, and encapsulates the conductive bumps 24, the first circuit structure 25 and the conductive posts 26.

In an embodiment, the first insulating layer 27 has a first surface 27a bonded to the first barrier layer 22 and a second surface 27b opposite to the first surface 27a and exposing the conductive posts 26 and the first conductive posts 251 of the first circuit structure 25. In an embodiment, a surface of the first circuit layer 250 is flush with the first surface 27a of the first insulating layer 27, and end surfaces of the conductive posts 26 and the first conductive posts 251 are flush with the second surface 27b of the first insulating layer 27. In another embodiment, the second surface 27b of the first insulating layer 27 is formed with a plurality of openings so as to expose the end surfaces of the conductive posts 26 and the first conductive posts 251.

In an embodiment, the first insulating layer 27 is formed by lamination or molding and made of a molding compound, a dry film, an epoxy resin, polyimide or other photosensitive or non-photosensitive organic resin.

Figure 2E:
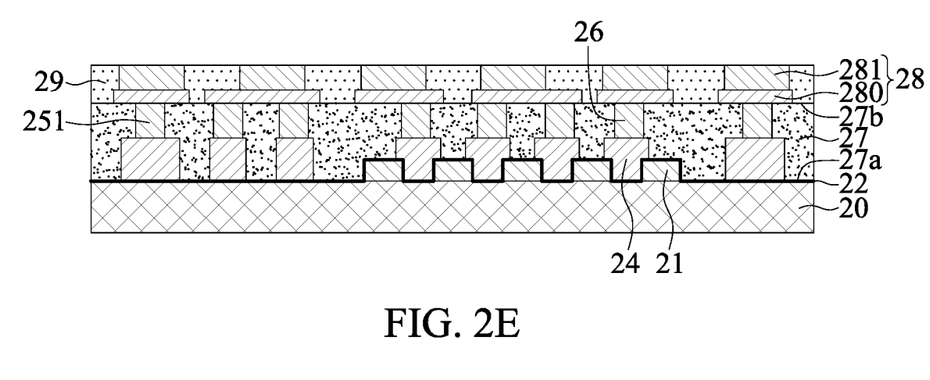

Referring to FIG. 2E, a second circuit structure 28 is disposed on the second surface 27b of the first insulating layer 27. Then, a second insulating layer 29 is formed on the second surface 27b of the first insulating layer 27 and encapsulates the second circuit structure 28, and a portion of the second circuit structure 28 is exposed from the second insulating layer 29.

In an embodiment, the second circuit structure 28 has a second circuit layer 280 formed on the second surface 27b of the first insulating layer 27 and a plurality of second conductive posts 281 disposed on the second circuit layer 22.

In an embodiment, the second circuit layer 280 is directly connected to the first conductive posts 251 and the conductive posts 26.

In an embodiment, the second conductive posts 281 are copper posts, and end surfaces of the second conductive posts 281 are exposed from the second insulating layer 29.

The second insulating layer 29 is formed by lamination or molding and made of a molding compound, a dry film, an epoxy resin, polyimide or other photosensitive or non-photosensitive organic resin.

Figure 2F:
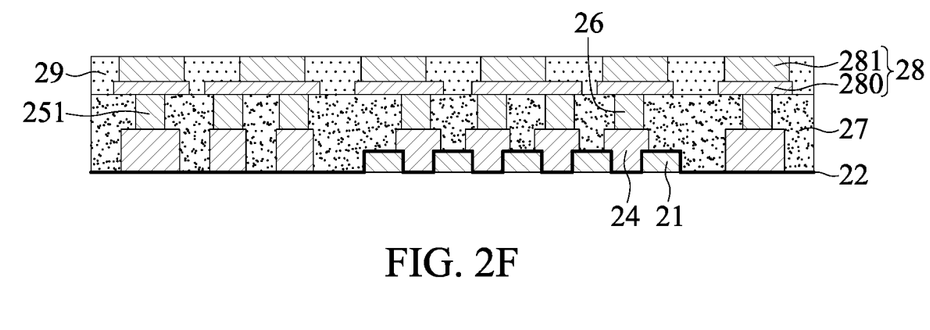

Referring to FIG. 2F, the carrier 20 is removed to expose the conductor layer 21 and the first barrier layer 22.

Figure 2G:
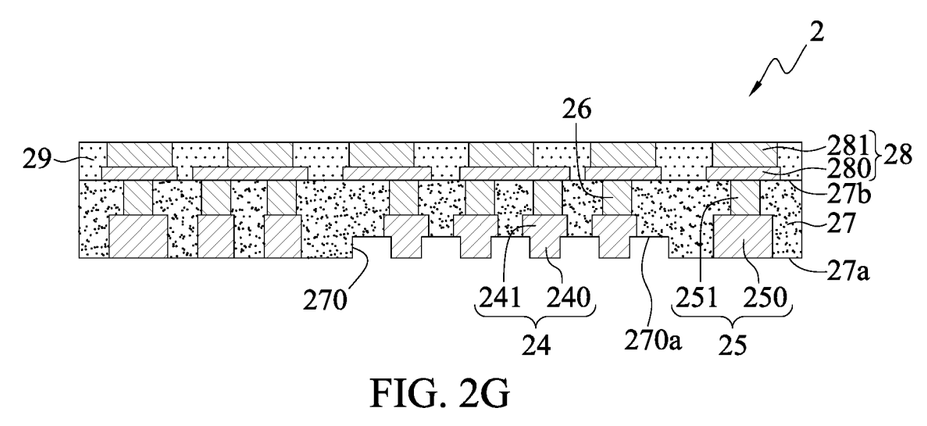

Referring to FIG. 2G, the entire conductor layer 21 and the entire first barrier layer 22 are removed. As such, a recessed portion 270 is formed on the first surface 27a of the first insulating layer 27, and the post bodies 240 of the conductive bumps 24 protrude from a bottom surface 270a of the recessed portion 270.

In an embodiment, the surface of the first circuit layer 250 is exposed from the first surface 27a of the first insulating layer 27.

Further, the entire conductor layer 21 and the entire first barrier layer 22 are removed by etching. In an embodiment, the first barrier layer 22 is removed after the conductor layer 21 is removed, and the first barrier layer 22 serves as an etch stop layer during removal of the conductor layer 21.

In another embodiment, referring to FIGS. 2F' and 2F", following the process of FIG. 2A', the second barrier layer 23 serves as an etch stop layer during removal of the conductor layer 21 and the first barrier layer 22 and thereafter the entire second barrier layer 23 is removed. As such, referring to FIG. 2G, a packaging substrate 2 is obtained.

FIGS. 3A to 3E are schematic cross-sectional views showing a method for fabricating a packaging substrate 3 according to a second embodiment of the present disclosure. The second embodiment differs from the first embodiment in the configuration of the first barrier layer.

Figure 3A:
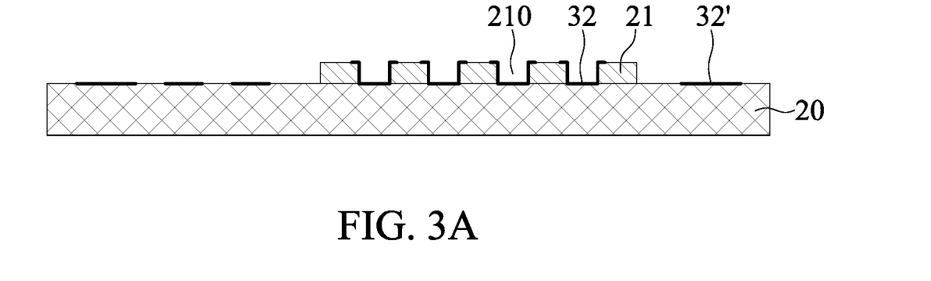
FIGS. 3A to 3E are schematic cross-sectional views showing a method for fabricating a packaging substrate according to a second embodiment of the present disclosure.

Referring to FIG. 3A, a conductor layer 21 having a plurality of openings 210 is formed on a carrier 20 by a patterning process. Then, a first barrier layer 32, 32' is formed on a portion of the surface of the conductor layer 21 in the openings 210 and a portion of the surface of the carrier 20 by a patterning process.

Figure 3B:
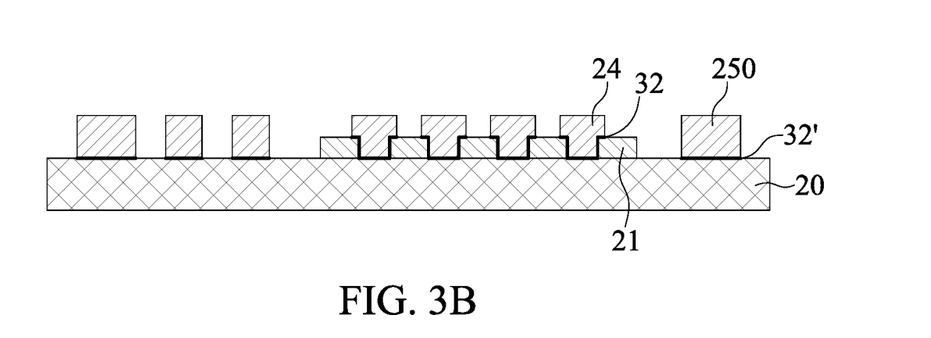

Referring to FIG. 3B, a plurality of conductive bumps 24 and a first circuit layer 250 are formed on the first barrier layer 32, 32' in a manner that the first barrier layer 32 bonded with the conductive bumps 24 is completely sandwiched between the conductive bumps 24 and the conductor layer 21 and the first barrier layer 32' on the carrier 20 is completely sandwiched between the carrier 20 and the first circuit layer 250.

Figure 3C:
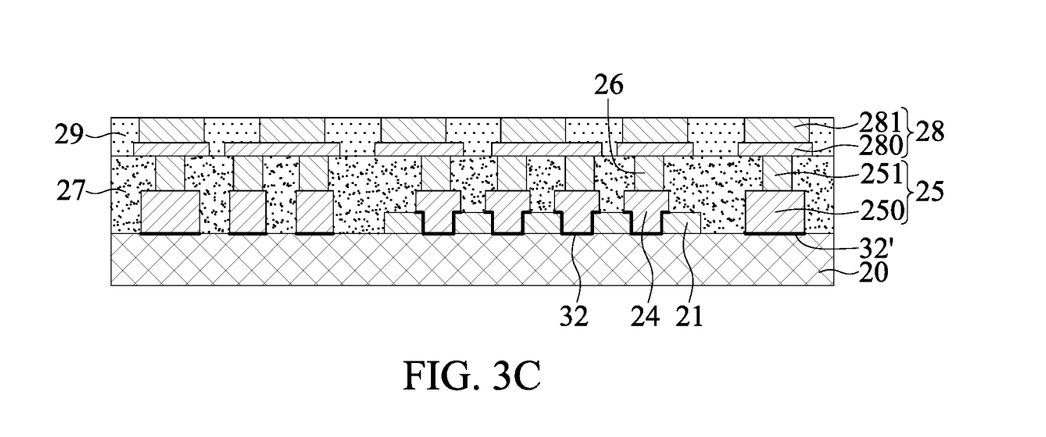

Referring to FIG. 3C, the processes of FIGS. 2C to 2E are performed.

Figure 3D:
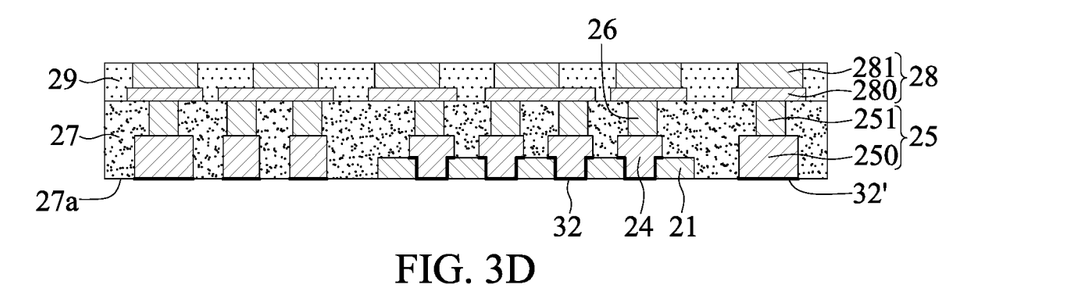

Referring to FIG. 3D, the carrier 20 is removed to expose the first surface 27a of the first insulating layer 27, the conductor layer 21 and the first barrier layer 32, 32'.

Figure 3E:
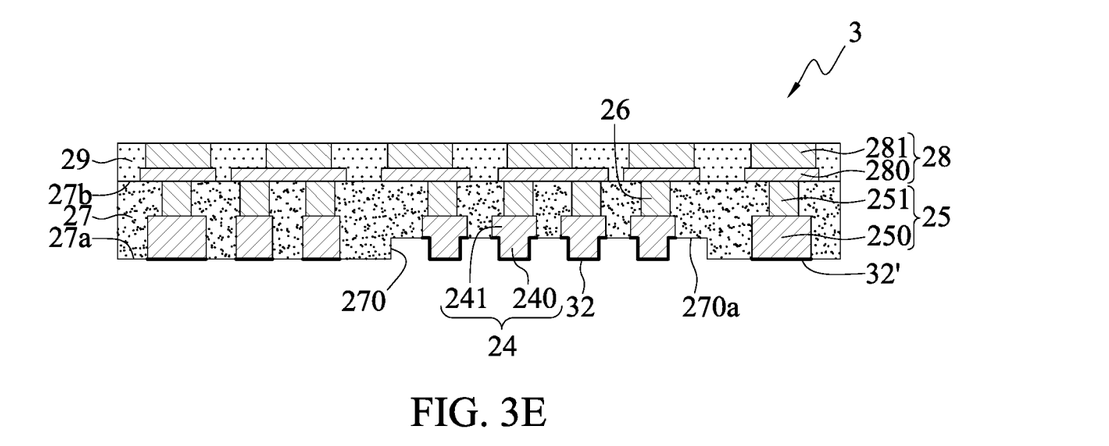

Referring to FIG. 3E, the entire conductor layer 21 is removed. As such, a recessed portion 270 is formed on the first surface 27a of the first insulating layer 27 and the post bodies 240 of the conductive bumps 24 protrude from a bottom surface 270a of the recessed portion 270.

In an embodiment, the first barrier layer 32 on the conductive bumps 24 is exposed from the recessed portion 270, and the first barrier layer 32' on the first circuit layer 250 is exposed from the first surface 27a of the first insulating layer 27.

According to the present disclosure, the conductive bumps 24 are formed on the packaging substrate 2, 3. Therefore, compared with the conventional process for fabricating copper pillars on a semiconductor chip, the present disclosure reduces costs and facilitates production.

Further, limited by the conductor layer 21 on the carrier 20, the electroplating process for forming the conductive bumps 24 is performed inward (i.e., from an outer side of the packaging substrate 2, 3 toward an inner side). As such, the end surfaces of the post bodies 240 of the conductive bumps 24 have a uniform height, thus meeting the fine-pitch requirement. That is, the post bodies 240 of uniform height can be arranged in a grid array having a good coplanarity so as to ensure uniform joint stresses and avoid damage of the packaging substrate 2, 3 or electronic elements 40 (to be described later) thereon.

Figure 4A:
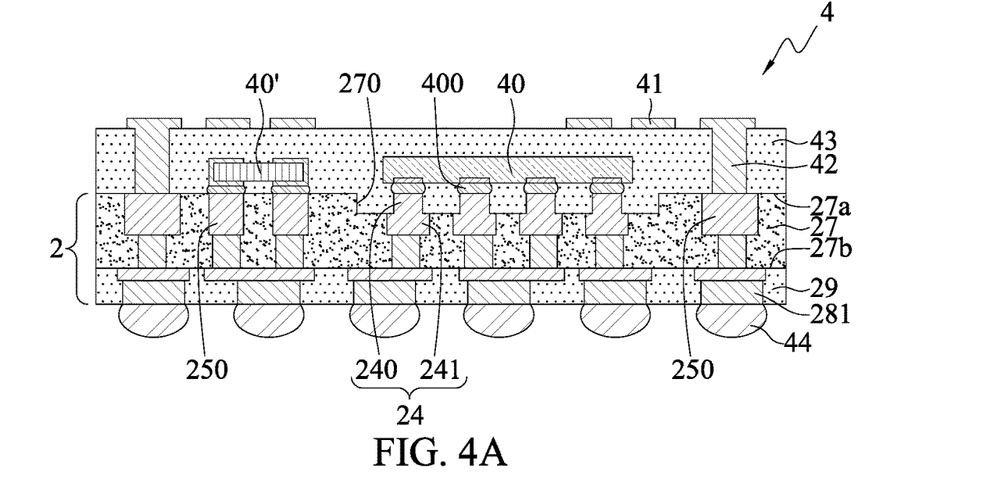
FIGS. 4A and 4B are schematic cross-sectional views showing application of the packaging substrate of FIG. 2G.
Figure 4B:
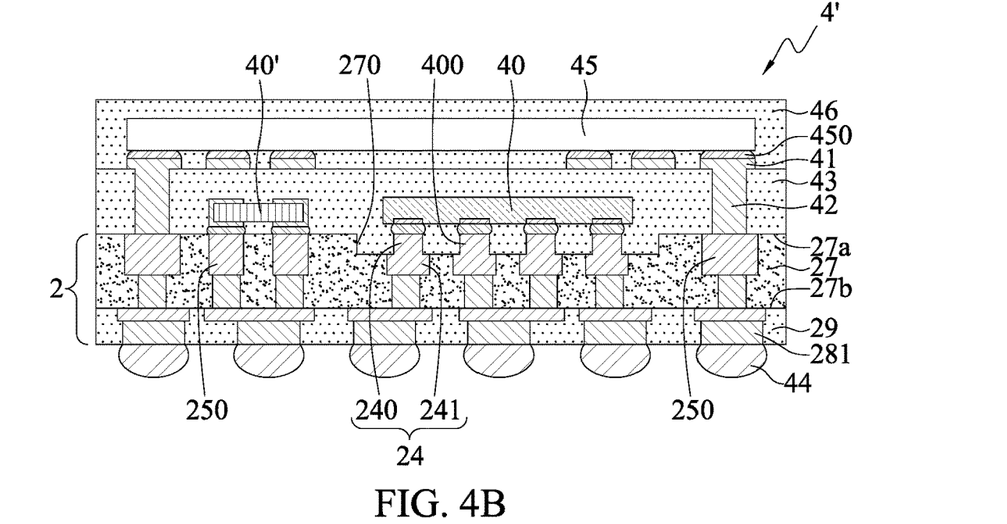
Figure 5:
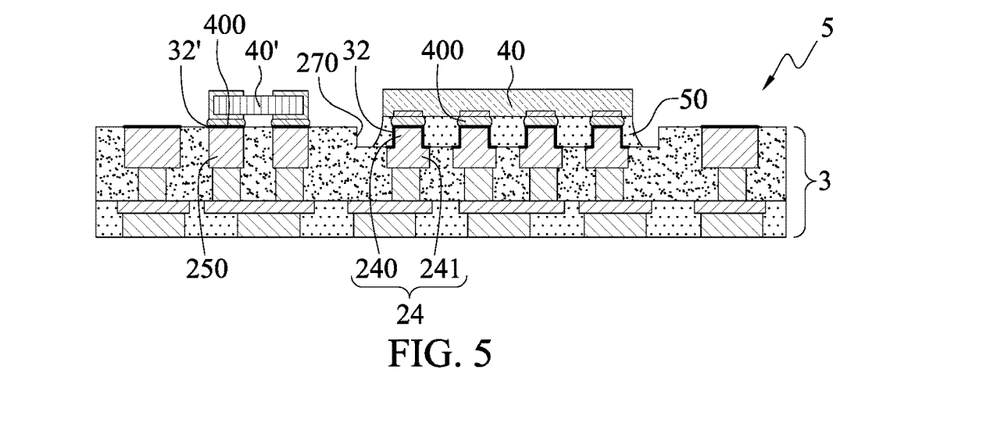
FIG. 5 is a schematic cross-sectional view showing application of the packaging substrate of FIG. 3E.

FIGS. 4A, 4B and 5 are schematic cross-sectional views showing electronic packages 4, 4', 5 formed by using the packaging substrates 2, 3 according to the present disclosure.

Referring to FIG. 4A, the packaging substrate 2 of FIG. 2G is used. At least an electronic element 40 is positioned corresponding to the recessed portion 270 and bonded to the post bodies 240 through a solder material 400. As such, the electronic element 40 is electrically connected to the conductive bumps 24. Further, another electronic element 40' is bonded to the first circuit layer 250 through the solder material 400.

In an embodiment, each of the electronic elements 40, 40' is an active element such as a semiconductor chip, a passive element, such as a resistor, a capacitor or an inductor, or a combination thereof. In an embodiment, the electronic element 40 on the post bodies 240 is an active element, and the electronic element 40' on the first circuit layer 250 is a passive element.

Further, a packaging layer 43 is formed on the first surface 27a of the first insulating layer 27 to encapsulate the post bodies 240, the electronic elements 40, 40' and the solder material 400, and a plurality of solder balls 44 are disposed on the second surface 27b of the first insulating layer 27 and electrically connected to the second conductive posts 281 so as to allow an electronic element (not shown) such as a circuit board to be disposed thereon.

Furthermore, a circuit layer 41 is formed on the packaging layer 43, and a plurality of conductors 42 are disposed in the packaging layer 43 for electrically connecting the circuit layer 41 and the first circuit layer 250.

Referring to FIG. 4B, through the configuration of the conductors 42 and the circuit layer 41, at least an electronic component 45 is further stacked over the packaging layer 43. As such, the present disclosure dispenses with a conventional silicon interposer and hence reduces the overall height of the electronic package 4 so as to meet the thinning and cost reduction requirements.

In an embodiment, the electronic component 45 is bonded and electrically connected to the circuit layer 41 through a plurality of conductive elements 450. In an embodiment, the conductive elements 450 are solder balls, solder bumps or copper pillars, and the electronic component 45 is an active element, a passive element, a package element, or a combination thereof. In an embodiment, the package element has a chip and an encapsulant encapsulating the chip. Further, an encapsulant 46 is optionally formed on the packaging layer 43 to encapsulate the electronic component 45.

On the other hand, in the electronic package 5 of FIG. 5, the packaging substrate 3 of FIG. 3E is used. An electronic element 40 is bonded to the first barrier layer 32 on the post bodies 240 through a solder material 400. As such, the electronic element 40 is electrically connected to the conductive bumps 24. Further, an underfill 50 is formed between the electronic element 40 and the recessed portions 270 to encapsulate the post bodies 240, the first barrier layer 32 and the solder material 400. Furthermore, another electronic element 40' is bonded to the first barrier layer 32' on the first circuit layer 250 through the solder material 400.

In an embodiment, the first barrier layer 32 (e.g., a nickel layer) has a good bonding with the solder material 400, thus strengthening the bonding between the electronic element 40 and the packaging substrate 3.

FIGS. 6A to 6E are schematic cross-sectional views showing a method for fabricating a packaging substrate 6 according to a third embodiment of the present disclosure. The third embodiment differs from the first and second embodiments in the omission of the first circuit structure 25.

Figure 6A:
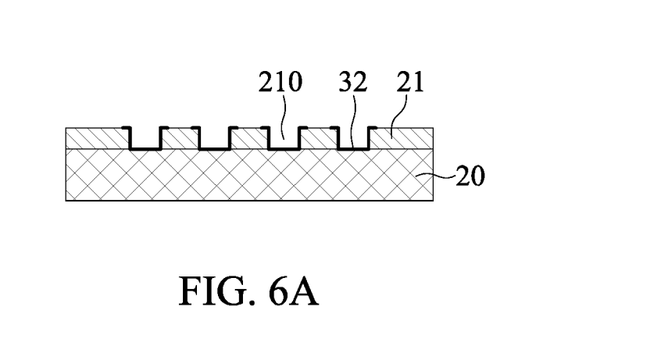
FIGS. 6A to 6E are schematic cross-sectional views showing a method for fabricating a packaging substrate according to a third embodiment of the present disclosure, wherein FIG. 6E' shows another embodiment of FIG. 6E.
Figure 6B:
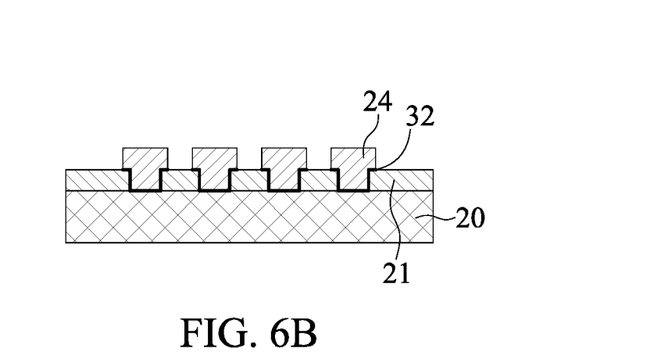

Referring to FIGS. 6A and 6B, the processes of FIGS. 3A and 3B are performed and the first circuit structure 25 is omitted.

Figure 6C:
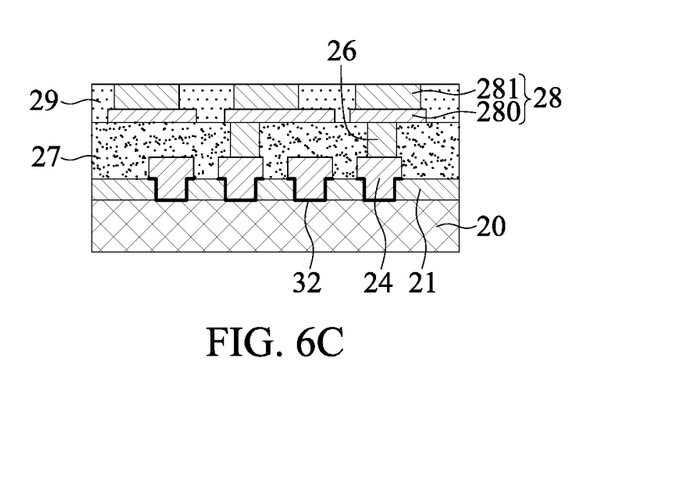

Referring to FIG. 6C, the process of FIG. 3C is performed and the second circuit layer 280 of the second circuit structure 28 is formed on the conductive posts 26.

Figure 6D:
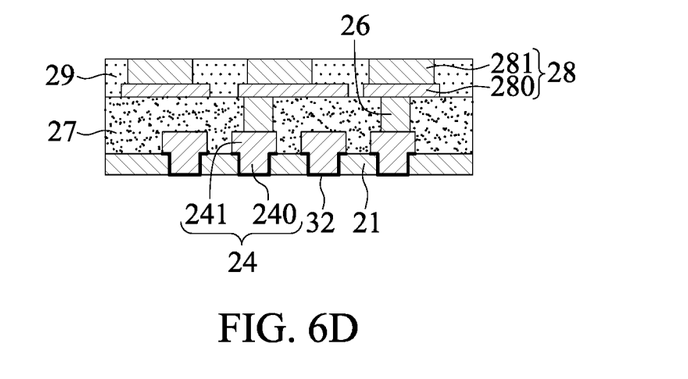

Referring to FIG. 6D, the carrier 20 is removed to expose the first surface 27a of the first insulating layer 27, the conductor layer 21 and the first barrier layer 32.

Figure 6E:
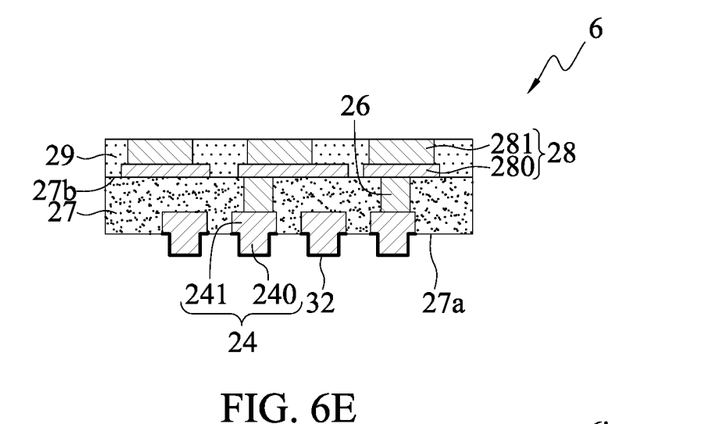

Referring to FIG. 6E, the entire conductor layer 21 is removed. As such, the post bodies 240 of the conductive bumps 24 protrude from the first surface 27a of the first insulating layer 27.

Alternatively, the processes of the first embodiment can be performed so as to obtain a packaging substrate 6' of FIG. 6E'.

Further, the packaging substrate 6, 6' according to the present embodiment can be used to form an electronic package as shown in FIGS. 4A and 5.

The present disclosure further provides a packaging substrate 2, 3, 6, 6', which has: a first insulating layer 27 having a first surface 27a and a second surface 27b opposite to the first surface 27a; a plurality of conductive bumps 24 disposed on the first surface 27a of the first insulating layer 27, wherein each of the conductive bumps 24 has a post body 240 exposed from the first surface 27a of the first insulating layer 27 and a conductive pad 241 embedded in the first insulating layer 27 and integrally formed with the post body 240, the width d of the post body 240 being less than the width r of the conductive pad 241; and a plurality of conductive posts 26 disposed on the conductive pads 241 and embedded in the first insulating layer 27, wherein end surfaces of the conductive posts 26 are exposed from the second surface 27b of the first insulating layer 27.

In an embodiment of the packaging substrate 6, 6', the post bodies 240 protrude from the first surface 27a of the first insulating layer 27.

In an embodiment of the packaging substrate 2, 3, at least a recessed portion 270 is formed on the first surface 27a of the first insulating layer 27 in a manner that the conductive bumps 240 are located in the recessed portion 270 and the post bodies 240 of the conductive bumps 24 protrude from a bottom surface 270a of the recessed portion 270.

In an embodiment, the packaging substrate 2, 3 further has a first circuit structure 25 disposed in the first insulating layer 27 and exposed from the first surface 27a and the second surface 27b of the first insulating layer 27.

In an embodiment, the packaging substrate 2, 3, 6, 6' further has a second circuit structure 28 disposed on the second surface 27b of the first insulating layer 27, and a second insulating layer 29 formed on the second surface 27b of the first insulating layer 27 to encapsulate the second circuit structure 28, wherein portions of the second circuit structure 28 are exposed from the second insulating layer 29.

In an embodiment, the packaging substrate 3, 6 further has a barrier layer 32 formed on the post bodies 240 and exposed from the first surface 27a of the first insulating layer 27.

Therefore, by forming conductive bumps on a packaging substrate instead of a semiconductor chip, the present disclosure reduces costs and facilitates production.

Further, limited by a conductor layer on a carrier, an electroplating process for forming the conductive bumps is performed inward. As such, end surfaces of the post bodies of the conductive bumps have a uniform height, thus meeting the fine-pitch requirement.

The above-described descriptions of the detailed embodiments are only to illustrate the preferred implementation according to the present disclosure, and it is not to limit the scope of the present disclosure. Accordingly, all modifications and variations completed by those with ordinary skill in the art should fall within the scope of present disclosure defined by the appended claims.

What is claimed is:

1. A method for fabricating a packaging substrate, comprising:
    forming on a carrier a conductor layer having a plurality of openings;
    disposing a plurality of conductive bumps on the conductor layer, wherein each of the conductive bumps has a post body formed in a corresponding one of the openings and a conductive pad disposed on the conductor layer, the post body being integrally formed with and less in width than the conductive pad;
    disposing a plurality of conductive posts on the conductive pads;
    forming on the carrier a first insulating layer encapsulating the conductive bumps and the conductive posts;
    removing the carrier; and
    removing entirety of the conductor layer to expose the post bodies from a first surface of the first insulating layer.

2. The method of claim 1, wherein the post bodies protrude from the first surface of the first insulating layer.

3. The method of claim 1, further comprising, after removing the entirety of the conductor layer, forming at a position corresponding to the conductor layer a recessed portion with the post bodies of the conductive bumps protruding from a bottom surface of the recessed portion.

4. The method of claim 1, further comprising, prior to forming the plurality of conductive bumps on the conductor layer, forming a first barrier layer on the conductor layer and in the openings.

5. The method of claim 4, further comprising forming the first barrier layer on the carrier.

6. The method of claim 5, further comprising, after removing the entirety of the conductor layer, removing entirety of the first barrier layer.

7. The method of claim 4, further comprising forming a second barrier layer on the first barrier layer.

8. The method of claim 7, further comprising, after removing the entirety of the conductor layer, removing entirety of the first barrier layer and entirety of the second barrier layer.

9. The method of claim 4, wherein the first barrier layer is formed only between the conductive bumps and the conductor layer.

10. The method of claim 9, wherein, after removing the entirety of the conductor layer, the first barrier layer is exposed from the first surface of the first insulating layer.

11. The method of claim 1, further comprising disposing on the carrier a first circuit structure encapsulated by the first insulating layer.

12. The method of claim 1, further comprising disposing a second circuit structure on the first insulating layer.

13. The method of claim 12, further comprising forming on the first insulating layer a second insulating layer encapsulating the second circuit structure with a portion of the second circuit structure exposed from the second insulating layer.

* * * * *